(12) United States Patent
Kuhwald (10) Patent No.: US 10,168,411 B2
(45) Date of Patent: Jan. 1, 2019

(54) MEASURING DEVICE AND A METHOD FOR MEASURING A HIGH-FREQUENCY SIGNAL WITH DEEMBEDDING

(71) Applicant: Rohde & Schwarz GmbH & Co. KG, Munich (DE)

(72) Inventor: Thomas Kuhwald, Markt Schwaben (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 0 days.

(21) Appl. No.: 15/031,676

(22) PCT Filed: Oct. 13, 2014

(86) PCT No.: PCT/EP2014/071863
§ 371 (c)(1),
(2) Date: Apr. 22, 2016

(87) PCT Pub. No.: WO2015/058988
PCT Pub. Date: Apr. 30, 2015

(65) Prior Publication Data
US 2016/0252600 A1    Sep. 1, 2016

(30) Foreign Application Priority Data
Oct. 22, 2013 (DE) .......... 10 2013 221 394

(51) Int. Cl.
*G01R 35/00* (2006.01)
*G01R 13/02* (2006.01)
(Continued)

(52) U.S. Cl.
CPC .......... *G01R 35/002* (2013.01); *G01R 13/029* (2013.01); *G01R 13/0254* (2013.01); *G01R 35/005* (2013.01)

(58) Field of Classification Search
CPC .... G01R 35/00; G01R 35/002; G01R 35/005; G01R 13/02; G01R 13/0254;
(Continued)

(56) References Cited

U.S. PATENT DOCUMENTS 5,698,984 A    12/1997  Little et al.
5,930,745 A *  7/1999  Swift ................. G01R 19/2509
                                                              702/190
(Continued)

FOREIGN PATENT DOCUMENTS

DE   102012006314 A1   10/2013
EP       1569005 A2    8/2005
EP       2113775 A1    11/2009
WO   WO2008016699 A2   2/2008

OTHER PUBLICATIONS

EPO, "International Preliminary Report on Patentability (English Translation)", PCT/EP2014/071863, dated Apr. 26, 2016.

*Primary Examiner* — Neel Shah
(74) *Attorney, Agent, or Firm* — Potomac Technology Law, LLC (57) ABSTRACT

The invention relates to a measuring device for measuring a high-frequency signal and a method for correcting a high-frequency signal superposed with measurement errors by means of the measuring device. The measurement is a time-domain measurement in real-time. The measuring device provides a measurement-signal input, an analog digital converter and a processing unit, wherein the measurement-signal input is connected to a device under test in order to measure the high-frequency signal. According to the invention a deembedding unit is arranged in the signal path of the measuring device between analog-digital converter and the processing unit in order to compensate measurement errors resulting from the connection of devices under test and measuring devices.

11 Claims, 4 Drawing Sheets

(51) Int. Cl.
  *G01R 27/04* (2006.01)
  *G01R 13/32* (2006.01)
  *G06F 19/00* (2018.01)
  *G01D 18/00* (2006.01)
  *H04B 1/00* (2006.01)

(58) Field of Classification Search
  CPC ...... G01R 13/029; G01R 27/04; G01R 13/32; G06F 19/00; G01D 18/00; H04B 1/00
  USPC ...... 324/74, 115, 130, 132, 601; 702/66, 85, 702/86, 90, 91, 108, 109, 116, 124
  See application file for complete search history.

(56) References Cited

U.S. PATENT DOCUMENTS

| | | | |
|---|---|---|---|
| 6,392,402 B1* | 5/2002 | Swift | G01R 15/125 324/132 |
| 6,772,079 B2 | 8/2004 | Stein et al. | |
| 2006/0224365 A1 | 10/2006 | Pickerd et al. | |
| 2007/0276614 A1 | 11/2007 | Tan et al. | |
| 2008/0031471 A1* | 2/2008 | Haulick | H03G 3/32 381/86 |
| 2008/0048674 A1* | 2/2008 | Tan | G01R 27/04 324/601 |
| 2008/0052028 A1 | 2/2008 | Pickerd et al. | |
| 2009/0125279 A1 | 5/2009 | Fakterman | |
| 2013/0099827 A1* | 4/2013 | Freidhof | G01R 13/32 327/90 |
| 2015/0066408 A1 | 3/2015 | Armbrecht et al. | |

\* cited by examiner

Fig. 7

MEASURING DEVICE AND A METHOD FOR MEASURING A HIGH-FREQUENCY SIGNAL WITH DEEMBEDDING

CROSS REFERENCE TO RELATED APPLICATIONS

The present application is a national phase application of PCT application No. PCT/EP2014/071863, filed Oct. 13, 2014, which claims priority to German Patent Application No. DE102013221394.8, filed Oct. 22, 2013, the entire contents of which are incorporated herein by reference.

FIELD

The invention relates to a measuring device, such as an oscilloscope, for measuring a high-frequency signal, and a method for correcting a high-frequency signal superposed with measurement errors by means of a measuring device.

BACKGROUND

In the case of measuring devices which implement a measurement of a broadband high-frequency signal in real-time in the time domain, the signal to be measured is very strongly influenced by the type and means of contacting of the device under test, for example, at a testing position, by means of a probe. In this context, a falsification of the actual characteristic curve of the measurement signal is caused by a plurality of effects, so that a measurement of the actually present signal becomes impossible.

Such measuring devices that measure the high-frequency signal in the time domain may comprise digital storage oscilloscopes. A deembedding, such as can be implemented with network analyzers, cannot be used in this form with measurements in the time domain because the mathematical operation corresponding to a multiplication in the frequency domain is a mathematical convolution operation in the time domain. Such convolution operations can only be realized with very large computational effort and can only be used on signals directed towards the past. Such computational operations cannot be used for a real-time analysis with broadband high-frequency signals.

Analyzing a high-frequency signal superposed with measurement errors in the time domain without the measurement errors having a significant influence on the presentation and analysis of the signal is therefore a general problem.

The publication EP 1 569 005 A2 proposes a calibration method in which a probe, which is provided for connecting a device under test to a measuring device, is fitted with a calibration unit. This calibration unit pre-distorts the high-frequency signal to be measured so that a subsequent distortion by the measuring device and the measurement cable is compensated. As a result of the complex mathematical operations, the calibration unit occupies a comparatively large volume and is therefore extremely unmanageable. An adaptation of such a probe for different devices under test is therefore possible only with difficulty. Beyond this, such a pre-distortion cannot completely compensate a measurement error.

Accordingly, there is a need for a measuring device and a method for operating the measuring device which can register and analyze a high-frequency signal reliably. Accordingly, any measurement errors which are superposed on the signal to be measured by the measurement setup can be reliably compensated.

SOME EXAMPLE EMBODIMENTS

Accordingly, embodiments of the present invention advantageously address the foregoing requirements and needs, as well as others, by providing a measuring device and a method for operating the measuring device which can register and analyze a high-frequency signal reliably. Accordingly, any measurement errors which are superposed on the signal to be measured by the measurement setup can be reliably compensated.

In accordance with example embodiments, a measuring device for measuring a high-frequency signal is provided. Accordingly, the measurement takes place as a time-domain measurement in real-time. The measuring device provides a measurement-signal input, an analog-digital converter and a processing unit. The measurement-signal input is connected to a device under test in order to measure the high-frequency signal. According to such embodiments a deembedding unit is arranged in the signal path of the measuring device between the analog-digital converter and the processing unit in order to compensate measurement errors resulting from the connection of device under test and measuring device.

The measurement errors which are superposed on the high-frequency signal to be measured are caused, in principle, by two types of effects. A first type of effect includes parasitic effects, especially resulting from parasitic inductances, capacitances and resistances of the probe, the measurement cable and/or the testing position on the device under test. These parasitic effects typically lead to a reduction of the bandwidth of the measurement system comprising device under test, connecting line and measuring device.

The second type of effects relates to the signal falsification resulting from error matchings of the wave resistances at the respective contact positions or respectively connecting positions.

With the deembedding unit (a unit for the elimination of embedding) between the analog-digital converter and the processing unit in the signal path of the measuring device, it is advantageous that a correction calculation is possible on the digital plane in order to correct measurement errors which are superposed on the high-frequency signal to be measured. Since the deembedding unit follows directly downstream of the digitization unit, a rapid calculation of the measurement errors is possible.

According to one such embodiment, the deembedding unit is an adaptive filter. Through the use of an adaptive filter, the deembedding unit can be adjusted to the respective device under test, so that different devices under test can easily be investigated.

According to a further embodiment, the deembedding unit comprises a filter cascade, wherein at least one equalizing filter is introduced into the filter cascade. By means of an equalizing filter, the first type of effects, caused by parasitic inductances, capacitances and resistances, can be effectively compensated. These parasitic effects typically lead to a reduction of the bandwidth of the measurement system, wherein the characteristic of the frequency responses in this context is predominantly a monotonic decline. By means of the equalizing filter, these monotonic declines are compensated in a simple and effective manner. The frequency response is raised again correspondingly at relatively higher frequencies.

According to a further embodiment, the deembedding unit comprises a filter cascade, wherein at least one echo-compensation filter is introduced into the filter cascade. Accordingly, the measurement errors which are superposed on the signal to be measured as a result of the second type of effects, can be readily compensated. The second type of effect occurs through error matchings of the wave resistances at the contact positions or respectively connecting positions. These error matchings lead to echoes of the signal to be measured on the signal lines, wherein the length of the measurement lines is included in the error pattern. This second type of effect leads to a very pronounced waviness in the frequency response, the period of which is dependent upon the length of the measurement cable. By means of an echo-compensation filter, this waviness in the frequency response can be filtered out, thereby achieving a compensation of the measurement errors.

By way of example, the deembedding unit is arranged in the signal path of the measuring device upstream of a trigger unit, so that the trigger unit receives a signal compensated with regard to the measurement errors in order to generate a trigger signal. It is advantageous that even the trigger unit receives an already compensated measurement signal, so that the trigger time can be positioned accurately on the un-falsified signal. The alternative would be that such a trigger signal could not be provided as a result of the falsification of the high-frequency signal. A trigger condition adapted to the measuring device would then never occur.

In the case of previous approaches to the compensation of these measurement errors, this has always been implemented through a downstream calculation in an optionally available software of the oscilloscope. The downstream calculation cannot be used with real-time signals with these bandwidths. Furthermore, the triggering in such methods always takes place in response to the uncorrelated signal, which is extremely problematic, especially in the case of very strong disturbances, and completely prevents the measurement and/or the triggering in the event of major falsifications of the high-frequency signal.

According to further example embodiments, the deembedding unit can be adapted to different devices under test on the basis of S-parameters determined previously using the measurement technology of the measuring device. This determination by measurement technology is implemented especially by determining degrees of transmission or respectively degrees of reflection through different configuration of the deembedding unit with different output resistances, especially with a load resistance of 50 ohms, a short resistance and an open line resistance. By determining the two types of effects in the form of scattering parameters, also designated as S-parameters, the properties of the measurement setup can be described completely with regard to transmission and reflection. If the S-parameters are known, these can be taken into consideration in the deembedding unit in the form of a correction calculation in order to remove the two types of effects described from the signal to be measured.

In an alternative embodiment, the deembedding unit can be adapted to different devices under test on the basis of S-parameters to be introduced into the measuring device. In this context, the fact is exploited, in particular, that the S parameters of the measurement setup are already known or have already been determined from a previous measurement setup. Such S-parameters need not then be determined again and can be loaded into the deembedding unit from a storage region of the measuring device or entered into the measuring device via user entries.

According to a further embodiment, the deembedding unit comprises at least one Finite-Impulse-Response filter, abbreviation: FIR-filter. This FIR-filter accordingly provides a defined number of levels which each provide a plurality of branches, English: taps. By means of this FIR-filter, it is possible to generate wavy frequency responses in a simple manner.

In accordance with further embodiments, the object is also achieved by a method for correcting a high-frequency signal superposed with measurement errors by means of a measuring device, wherein the correction takes place in real-time and by means of a time-domain measurement. The measurement comprises an adaptation step, wherein the deembedding unit in the measuring device is adapted to different devices under test on the basis of S-parameters. Furthermore, a capture step is provided in order to capture the high-frequency signal. Following this, a digitization step is provided in order to digitize the captured high-frequency signal. Finally, a correction step is carried out, in which the digitized high-frequency signal is corrected through compensation of the measurement errors by means of the deembedding unit.

BRIEF DESCRIPTION OF THE DRAWINGS

In the following, further embodiments and advantages of the invention are explained in greater detail by way of example on the basis of drawings, wherein the drawings describe only exemplary embodiments of the invention. Identical components in the drawings are provided with identical reference numbers. The drawings should not be regarded as true to scale. Individual elements of the drawings may have been illustrated in an over-large scale or respectively in an oversimplified manner. The drawings show.

DETAILED DESCRIPTION

Figure 1:
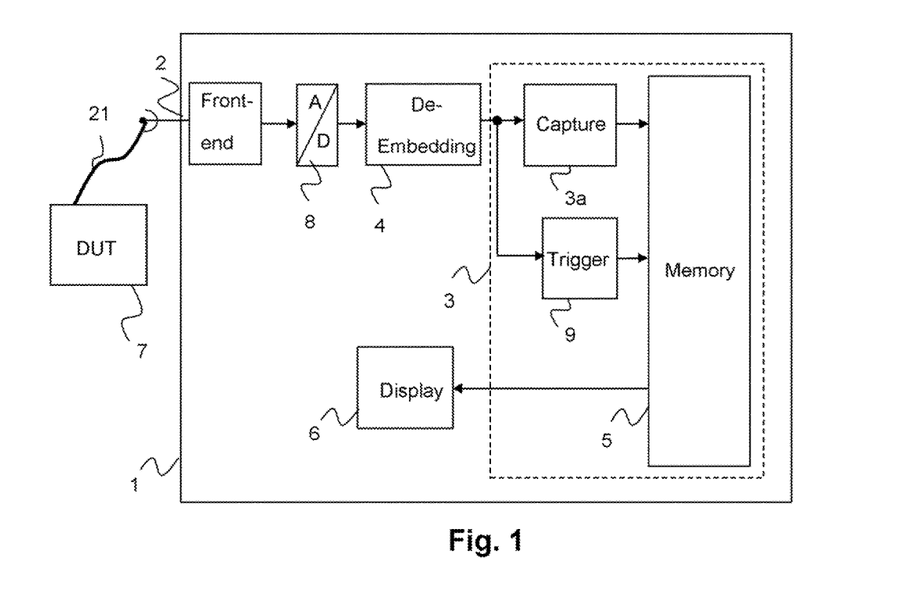
FIG. 1 shows a block diagram of a measuring device according to example embodiments of the invention.

FIG. 1 shows an exemplary embodiment of the measuring device 1 according to example embodiments of the invention. The measuring device 1 provides a measurement-signal input 2. A probe 21, which is connected in turn to a device under test 7, is connected to the measurement input 2. The measuring device 1 provides an analog-digital converter 8 and a processing unit 3. A deembedding unit 4 is provided in the signal path between analog-digital converter 8 and processing unit 3. Furthermore, the measuring device 1 optionally provides a display unit 6.

Using the measurement-signal input 2, the accordingly connected probe 21 and the contact of a testing position on the device under test 7, high-frequency signals can be captured and analyzed in the time domain. In this context, the measuring device 1 is, in particular, a time domain measuring device, for example, a digital storage oscilloscope. By way of example, the high-frequency signals to be measured are broadband signals that may provide a bandwidth above 4 GHz. As a result of the measurement setup shown in FIG. 1, measurement errors are superposed on the measurement signal. These measurement errors lead to a falsified display of the signal on the display unit 6. In the case of large falsifications, a triggering by means of a trigger unit 9 is impossible because the triggering conditions set may possibly not be captured in the high-frequency signal.

In accordance with example embodiments, after the digitization of the high-frequency signal to be measured by means of the analog-digital converter 8, the high-frequency signal is supplied to a deembedding unit 4. In the deembedding unit 4, the measurement errors which are superposed on the high-frequency signal as a result of the measurement setup are calculated out. Only then is the high-frequency signal supplied to the processing unit 3. In this context, the processing unit 3 provides, in particular, a trigger unit 9, a storage unit 5 and a capture unit 3a.

If the scattering parameters required for the compensation of the measurement setup are known in the deembedding unit 4, the measurement errors can be calculated out in a targeted manner by means of an adaptive filter. For this purpose, calculation circuits, such as FPGA, ASIC, DSP, which allow the measurement errors to be calculated out in the time domain, are integrated in the deembedding unit 4.

The measurement errors occur, for example, as two different types of effects. A first type of effects are, in particular, the parasitic effects resulting from inductances, capacitances and resistances of the measurement setup. The parasitic effects resulting from inductances, capacitances and resistances lead to a reduction of the bandwidth, so that a monotonic decline of the frequency is caused in the frequency response. Such a parasitic effect can be compensated by a corresponding adaptive equalizing filter 41 in the deembedding unit 4. For this purpose, an equalizing filter 41 which provides a frequency response which counteracts the parasitic effects must be provided. Accordingly, the frequency response, which is monotonically declining as a result of the measurement errors, is raised again and, following this, an at least almost constant frequency-response characteristic is obtained.

The second type of effect occurs as a result of error matching of the wave resistances. Such error matchings lead to echoes of the high-frequency signals on the measurement line 21 through transmission and reflection. Such an effect can also be compensated through a so-called echo filter 42 in the deembedding unit 4.

Figure 2:
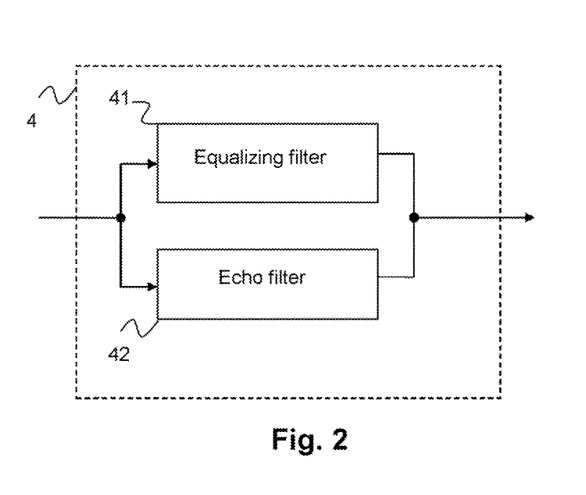
FIG. 2 shows a block diagram of the deembedding unit of the measuring device of FIG. 1 according to example embodiments of the invention.

FIG. 2 shows a deembedding unit 4 according to example embodiments of the invention. The deembedding unit 4 provides a filter cascade comprising an equalizing filter 41 and an echo filter 42. By means of these two filters 41, 42, the two types of effects can be removed from the high-frequency signal to be measured separately from one another, so that the compensated high-frequency signal is obtained at the output of the deembedding unit 4.

Figure 3:
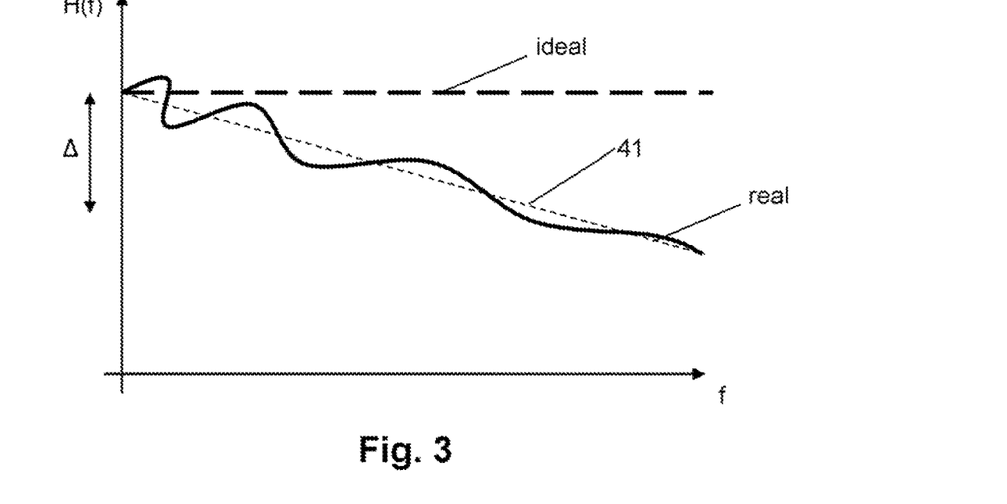
FIG. 3 a graphical representation of a transmission function of a measurement setup in the frequency domain, in which measurement errors are superposed on a high-frequency signal, according to example embodiments of the invention.

FIG. 3 shows the transmission function of a measurement setup in the frequency domain. For comparison purposes, the ideal characteristic of the function is shown in FIG. 3 with a dashed line, alongside the real characteristic of the transmission function. As a result of the first type of effects, the real transmission function provides a monotonic decline of the frequency response. This causes a reduction in the bandwidth by lowering the upper limit frequency of the measurement system. In this context, broadband signals are falsified more strongly as the frequency increases. The decline in the frequency response can be accordingly compensated through the use of an equalizing filter 42 in the deembedding unit 4.

Figure 4:
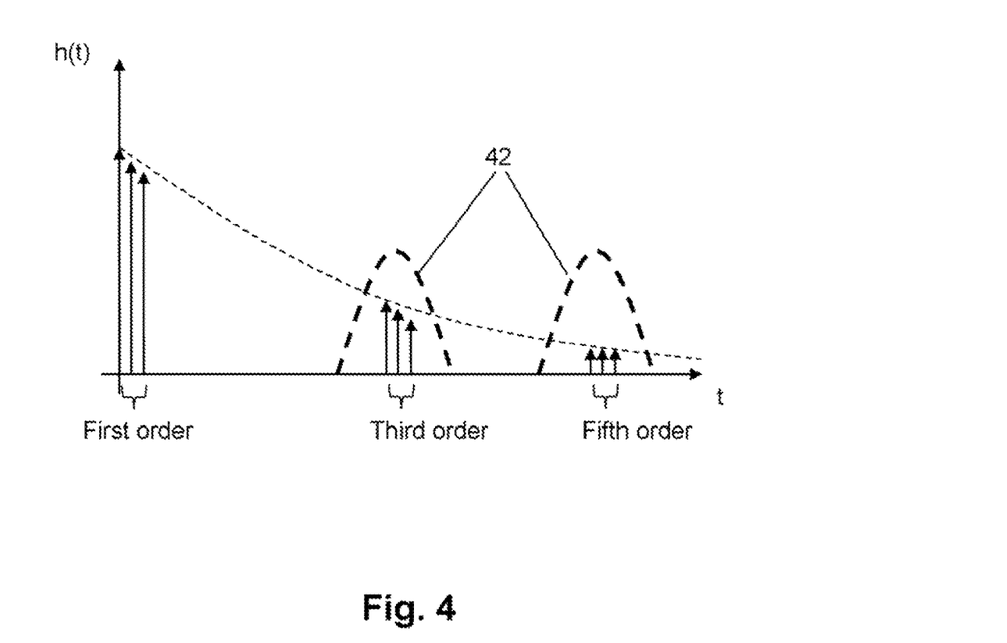
FIG. 4 shows a graphical representation of the associated impulse response of the transmission function shown in FIG. 3.

FIG. 4 shows the transmission function from FIG. 3 in the time domain. Accordingly, the echoes which occur as a result of delay-time echoes on the line caused by error matching of the wave resistances are shown in particular. Between the first order and the third order at the end of the measurement line 21, a given time passes in which no disturbances occur on the line. Such echoes can be filtered out very easily through parameterization of an echo filter 42 in the deembedding unit 4. As a result of error matchings, echoes occur at the ends of the measurement line 21, that is, reflections of the high-frequency signal, which are subsequently fed back into the measurement line 21. In due course, these reflections reach the testing position of the device under test 7 again, where they are also reflected as a result of error matchings. During the transmission of the echoes on the measurement line, they are superposed on the measurement signal actually to be captured and must be removed from the measurement signal as effects of the second type. The invention provides for the use of at least one of these echo filters 42 to compensate the high-frequency signal with superposed measurement error.

Figure 5:
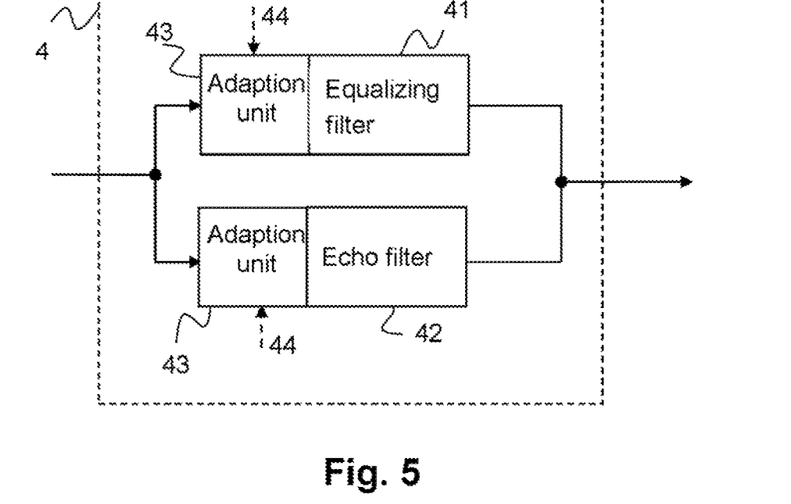
FIG. 5 shows a block diagram of an alternative embodiment of the deembedding unit of the measuring device of FIG. 1 according to example embodiments of the invention.

FIG. 5 shows the adaptation of such a deembedding unit 4. S-parameters 44 are supplied to the adaptive unit 43. These S parameters are either already present in a storage unit in the measuring device 1 or are to be entered by means of an entry menu in the measuring device 1. Such S-parameters must therefore be made known to the user, for example, even at the time of purchase of a measurement cable. Alternatively, the S-parameters have been determined in a preceding measurement step. As a result of the S-parameterization 44, the equalization filter 41 and the echo filter 42 are adapted to the respective device under test 7. In this manner, it is possible to analyze different devices under test 7 and to compensate the superposed measurement errors accurately.

Figure 6:
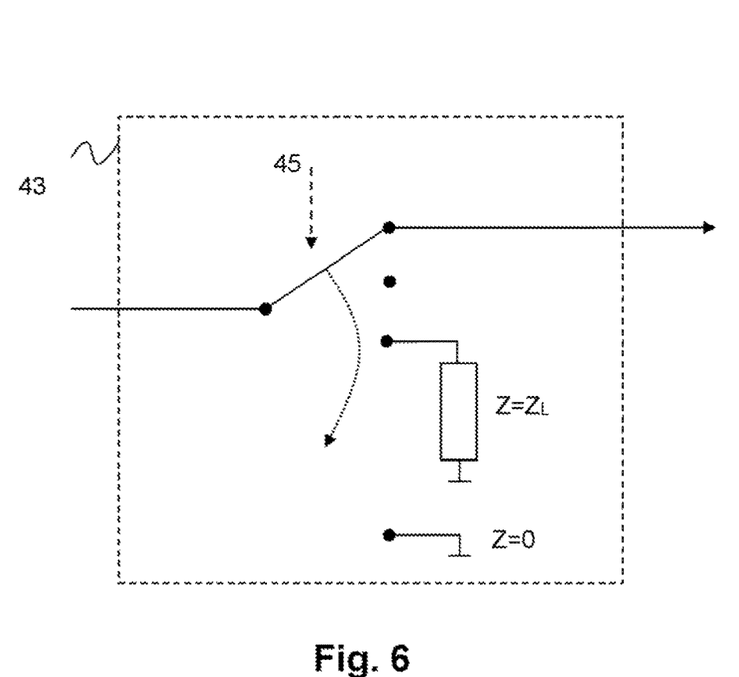
FIG. 6 shows a block diagram of the adaptation unit for determining the scattering parameters, according to example embodiments of the invention.

FIG. 6 shows an alternative exemplary embodiment of the adaptation unit 43 from FIG. 5. As shown in FIG. 6, the S-parameters are determined using measurement technology in the deembedding unit 4. For this purpose, a defined status of the measurement setup is varied by means of a determination unit 45. The variation includes the short-circuiting of the measurement-signal input 21 to a reference potential. Furthermore, the variation includes the connection of a defined load resistance $Z_L$ to the measurement-signal input 21. Additionally, in a third variation, the measurement-signal input 21 is left open. In all of these three defined statuses, the degree of transmission and reflection of the measurement setup is determined and the S-parameters 44 are measured. These S-parameters are then valid for the respective device under test 7. In the case of a connection and investigation of another device under test 7, the S-parameters are determined again.

Figure 7:
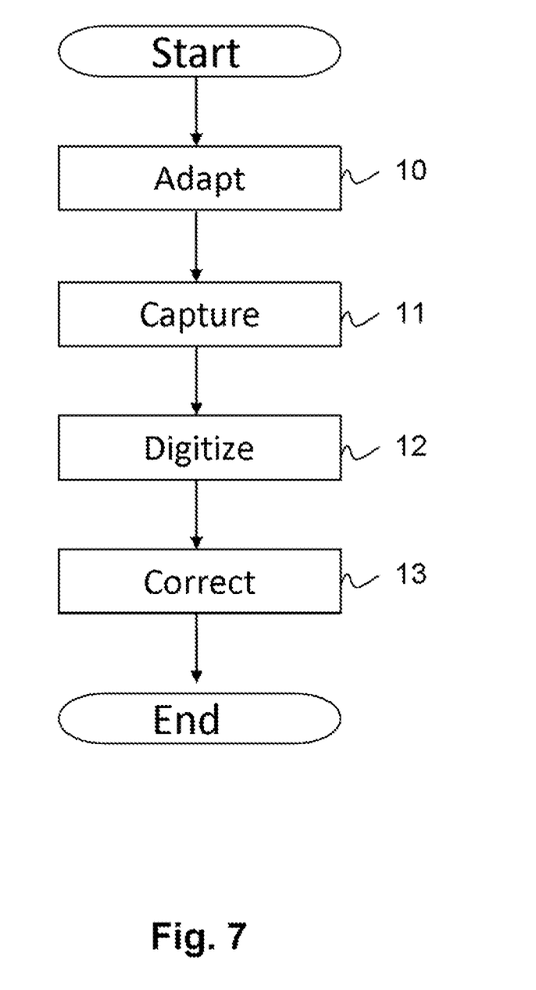
FIG. 7 shows a method flow diagram of a method according to example embodiments of the invention.

FIG. 7 shows a method flow diagram of a method according to the invention. For this purpose, in a first step 10, the deembedding unit 4 of the measuring device 1 is adapted to different devices under test 7 on the basis of S-parameters 44. In a downstream capture step 11, the capture of the high-frequency signal is implemented, wherein the high-frequency signal is captured in the time domain and in real-time and is superposed at the time of capture with a measurement error. In a subsequent step 12, the high-frequency signal is digitized. Following this, in a correction step 13, the correction of the digitized high-frequency signal is implemented by compensating the measurement error by means of the deembedding unit 4 according to the invention.

In contrast to network analyzers, the measurement of the measurement signal takes place by means of a digital storage oscilloscope as measuring device 1 in the time domain. In particular, the measurement can be implemented in real-time. Because of the different treatment of the two types of effects and the different treatment of the effects by an equalizing filter 41 and respectively an echo filter 42, both types of effects can be eliminated separately. The measurement errors are then removed from the high-frequency signal. In this manner, a compensated high-frequency signal can then also be connected to a trigger unit 9.

An effort-intensive transformation of the high-frequency measurement signal into a frequency domain is accordingly not necessary, a rapid analysis of the signal is achieved. Other filters can also be integrated into the cascade. All of the elements described and/or illustrated and/or claimed can be combined arbitrarily with one another within the scope of the invention.

While various embodiments of the present invention have been described above, it should be understood that they have been presented by way of example only, and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

Although the invention has been illustrated and described with respect to one or more implementations, equivalent alterations and modifications will occur to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

The invention claimed is:

1. A measurement apparatus for measuring a high-frequency signal, wherein the measurement comprises a time-domain measurement in real-time, the measurement apparatus comprising:
   an analog input configured to interface with a device under test (DUT) and to receive the high-frequency signal from the DUT;
   an analog-to-digital converter (ADC) configured to digitize the high-frequency signal;
   a signal processor; and
   a signal deembedding circuit, disposed in a signal path between the ADC and the signal processor; and
   wherein the signal deembedding circuit is configured to receive predetermined S-parameters associated with the DUT to in order to configure the signal deembedding circuit for the DUT based on the predetermined S-parameters,
   wherein the signal deembedding circuit is configured to generate a compensated signal by compensating for signal effects in the high-frequency signal resulting from the interface between the analog input and the DUT, wherein the signal effects include echoes due to error matchings of the interface, wherein the signal deembedding circuit comprises at least one echo-compensation filter configured to compensate for the echoes, wherein the signal deembedding circuit facilitates a correction calculation on the digital plane in order to correct measurement errors which are superposed on the high-frequency signal to be measured, and
   wherein the signal processor is configured to receive and further process the compensated signal for the time-domain measurement.

2. The measurement apparatus according to claim 1, wherein the signal deembedding circuit comprises an adaptive filter.

3. The measurement apparatus according to claim 1, wherein the signal deembedding circuit comprises a filter cascade including at least one equalizing filter.

4. The measurement apparatus according to claim 1, wherein the signal deembedding circuit comprises a filter cascade including the at least one echo-compensation filter.

5. The measurement apparatus according to claim 1, further comprising:
   a trigger circuit, disposed between the signal deembedding circuit and the signal processor, configured to generate a trigger signal for the time-domain measurement.

6. The measurement apparatus according to claim 1, further comprising:
   an adaptation circuit configured to determine the S-parameters associated with the DUT.

7. The measurement apparatus according to claim 1, wherein the signal deembedding circuit comprises at least one finite impulse response (FIR) filter.

8. A method for measuring a high-frequency signal, wherein the measurement comprises a time-domain measurement in real-time, the method comprising:
   receiving, by a measurement device, the high-frequency signal from a device under test (DUT);
   digitizing, by an analog to digital converter, the high-frequency signal;
   configuring a signal deembedding circuit for the DUT based on predetermined S-parameters,
   generating, by the signal deembedding circuit, a compensated signal by compensating for signal effects in the high-frequency signal resulting from an interface between the DUT and the measurement device, wherein the signal effects include echoes due to error matchings of the interface, wherein the compensating for the signal effects in the high-frequency signal comprises compensating, by at least one echo-compensation filter, for the echoes, and wherein the signal deembedding circuit facilitates a correction calculation on the digital plane in order to correct measurement errors which are superposed on the high-frequency signal to be measured; and
   processing, by a signal processor, the compensated signal for the time-domain measurement.

9. The method according to claim 8, wherein the compensating for the signal effects in the high-frequency signal comprises at least one correction of a decline in a frequency response by means of an equalizing filter.

10. The method according to claim 8, wherein the compensating for the signal effects in the high-frequency signal comprises at least one registration of echoes of the high-frequency signal and a filtering out of the registered echoes by means of the at least one echo-compensation filter.

11. The method according to claim 8, further comprising:
   determining the S-parameters associated with the DUT; and configuring the measurement device for the DUT based on the determined S-parameters.

* * * * *